(12) United States Patent
Yamamoto et al.

(10) Patent No.: US 7,432,589 B2
(45) Date of Patent: Oct. 7, 2008

(54) SEMICONDUCTOR DEVICE

(75) Inventors: Saiki Yamamoto, Tokushima (JP); Ikuya Nii, Anan-shi (JP); Hiroaki Ukawa, Tokushima (JP)

(73) Assignee: Nichia Corporation, Anan-shi, Tokushima (JP)

( * ) Notice: Subject to any disclaimer, the term of this patent is extended or adjusted under 35 U.S.C. 154(b) by 20 days.

(21) Appl. No.: 11/785,380

(22) Filed: Apr. 17, 2007

(65) Prior Publication Data
US 2007/0246841 A1    Oct. 25, 2007

(30) Foreign Application Priority Data
Apr. 19, 2006  (JP) .......................... P2006-115771
Dec. 20, 2006  (JP) .......................... P2006-342341

(51) Int. Cl.
*H01L 23/52* (2006.01)
(52) U.S. Cl. ...................................... 257/690; 257/701
(58) Field of Classification Search ................ 257/678, 257/687, 701, 702, 703, 704, 783, 784, 690
See application file for complete search history.

(56) References Cited

U.S. PATENT DOCUMENTS

| | | | | |
|---|---|---|---|---|
| 5,261,157 | A * | 11/1993 | Chang ........................... | 29/844 |
| 5,650,593 | A * | 7/1997 | McMillan et al. ............ | 174/542 |
| 6,426,565 | B1 * | 7/2002 | Bhatt et al. ................... | 257/783 |
| 6,856,357 | B1 * | 2/2005 | Stevenson .................... | 348/373 |
| 6,861,747 | B2 * | 3/2005 | Miyazaki et al. ............. | 257/718 |
| 7,045,905 | B2 | 5/2006 | Nakashima | |
| 2005/0199884 | A1 * | 9/2005 | Lee et al. ....................... | 257/79 |
| 2005/0221537 | A1 * | 10/2005 | Tomabechi et al. .......... | 438/122 |
| 2006/0170083 | A1 | 8/2006 | Kim et al. | |
| 2006/0175716 | A1 | 8/2006 | Nakashima | |
| 2008/0130935 | A1 * | 6/2008 | Sato et al. .................... | 381/361 |

FOREIGN PATENT DOCUMENTS

| | | |
|---|---|---|
| JP | 62-47156 U | 3/1987 |
| JP | 10-294495 A | 11/1998 |
| JP | 200533194 A | 2/2005 |
| JP | 2006210909 A | 8/2006 |

* cited by examiner

*Primary Examiner*—S. V Clark
(74) *Attorney, Agent, or Firm*—Birch, Stewart, Kolasch and Birch, LLP

(57) ABSTRACT

The present invention provides a semiconductor device capable of preventing an adhesive for die bonding from flowing to wire bonding area.

The semiconductor device of the present invention comprises a semiconductor element 28 having a pair of electrodes, a housing 12 having the recess 14 for accommodating the semiconductor element 28, a first lead electrode 18 and the second lead electrode 20 which are exposed on the bottom of the recess 14, an adhesive layer 30 for die bonding between the semiconductor element 28 and the first lead electrode 18, and electrically conductive wires 32 for wire bonding between one electrode of the pair of electrodes of the semiconductor element and the first lead electrode 18 and between the other electrode and the second lead electrode 20, wherein the housing 12 has the wall 26 formed to extend across the bottom surface of the recess 14 so as to divide the surface of the first lead electrode 18 into a die bonding area 22 and a wire bonding area 24, and the first lead electrode 18 has the notch 36 which is formed by cutting off a portion of an edge of the first lead electrode 18 and located at least just below the wall 26, while the wall 26 and the bottom portion 40 of the housing 12 are connected to each other through the notch 36.

6 Claims, 14 Drawing Sheets

SEMICONDUCTOR DEVICE

BACKGROUND OF THE INVENTION

1. Field of the Invention

The present invention relates to a semiconductor device having a semiconductor element mounted in a housing thereof, and particularly to a semiconductor light emitting device employing a semiconductor light emitting element and a semiconductor light receiving device used as photo sensor or the like.

2. Description of the Related Art

Semiconductor devices currently available include a semiconductor light emitting device which has a semiconductor light emitting element mounted in a housing. The housing has a recess for accommodating the semiconductor light emitting element, and exposed on the surface of the recess are a pair of lead electrodes which are connected to the electrodes of the semiconductor light emitting element. The semiconductor light emitting element is mounted in the housing by die bonding the substrate side of the semiconductor light emitting element onto one of the lead electrodes by means of a silver paste or the like, and connecting the semiconductor side of the semiconductor light emitting element to the other lead electrode by means of an electrically conductive wire.

As the semiconductor device becomes smaller year by year, the housing also becomes smaller and accordingly the recess of the housing and the lead electrodes exposed in the recess become smaller in size. When the semiconductor element is mounted in the small housing, bleeding phenomenon, that is to say, flowing the silver paste for die bonding from the one lead electrode to the other lead electrode is likely to occur, eventually causing short circuiting of the semiconductor device. It is known to prevent the bleeding phenomenon by providing a protrusion between the lead electrodes (refer to, for example, Japanese Unexamined Patent Publication (Kokai) No. 10-294495 and Japanese Unexamined Utility Model Publication (Kokai) No. 62-47156).

In a light emitting device comprising an LED chip and a protective element (Zener diode) in such a constitution as the protective element is die bonded on a negative lead electrode and the LED chip is wire bonded on the same negative lead electrode, a first bonding region where die bonding is carried out and a second bonding region where wire bonding is carried out are separated from each other by a wall (refer to, for example, Japanese Unexamined Patent Publication (Kokai) No. 2005-33194). The wall prevents the die bonding material for die bonding of the protective element from flowing into the second bonding region.

In a semiconductor light emitting element employing nitride semiconductor, the semiconductor element is formed on an insulating substrate such as sapphire, which disables electrical continuity to be established through the substrate. For this reason, both a positive electrode and a negative electrode of the semiconductor light emitting element are formed on the semiconductor side, and are wire bonded to the corresponding lead electrodes when mounting the element. At this time, the semiconductor light emitting element is bonded onto either of the lead electrodes by means of an electrically conductive adhesive such as silver paste or an insulating adhesive such as die bonding resin.

In case an adhesive including a liquid component such as plasticizer of low surface tension is used when die bonding the semiconductor light emitting element, the liquid component of the adhesive and the adhesive itself (these will be collectively referred to as adhesive components) can easily spread over the surface of the lead electrode (which is also bleeding phenomenon) so as to cover the surface of the lead electrode, even when application of the adhesive is limited to the die bonding area of the lead electrode. Particularly when both die bonding and wire bonding are carried out in the same lead electrode, the die bonding area and the wire bonding area are disposed adjacent to each other on the same surface of the same lead electrode, and therefore the adhesive components can very easily overflow. Bleeding phenomenon can occur far more easily in this case than in the prior art in which the lead electrodes are disposed apart from each other. If the lead electrode is covered by the adhesive components after die bonding, the electrically conductive wire connecting the lead electrode and the electrode of the semiconductor light emitting element cannot be fixed sufficiently on the lead electrode when wire bonding, and it becomes impossible to establish electrical continuity by means of the electrically conductive wire in case an insulating adhesive is used.

The constitutions described in Japanese Unexamined Patent Publication (Kokai) No. 10-294495 and Japanese Unexamined Utility Model Publication (Kokai) No. 62-471562 use semiconductor light emitting element having an electrically conductive substrate, and is capable of establishing electrical continuity between the semiconductor light emitting element and the lead electrode while securing the electrically conductive substrate of the semiconductor light emitting element on the lead electrode by die bonding with an adhesive layer consisting of an electrically conductive adhesive. Therefore, while such a structure is provided that prevents bleeding phenomenon between the lead electrodes in order to avoid short circuiting between the two lead electrodes, spreading of the adhesive for die bonding over the surface of the lead electrode to be die bonded does not pose a problem. Accordingly, there is no means disclosed for preventing the adhesive components from spreading over the surface of the lead electrode.

It may seem that this problem could be solved by providing the wall on the surface of the lead electrode as disclosed in Japanese Unexamined Patent Publication (Kokai) No. 2005-33194.

However, with the light emitting devices of these days which have become extremely small and thin, new problems that cannot be solved by the technology of Japanese Unexamined Patent Publication (Kokai) No. 2005-33194 have emerged when it is attempted to form the wall.

First, since the wall is limited to small dimensions in width and height, sufficient quantity of a material to form the wall may not be put into a mold groove which is provided with a mold in order to mold the wall. Particularly when the molding material has a high viscosity, the mold groove may not be filled satisfactorily with the molding material thus resulting in the wall having defects.

Second, adhesiveness between the wall and the lead electrode can be weak, thus giving rise to the possibility of leak of the adhesive components along the interface thereof. This can cause significant influence particularly when the adhesive component has low surface tension.

SUMMARY OF THE INVENTION

With the background described above, an object of the present invention is to provide a semiconductor device wherein the adhesive components do not overflow nor leak to the wire bonding area even when an adhesive consisting of adhesive components having low surface tension is used in the adhesive layer for die bonding, and the overflow and leak preventing function can be maintained satisfactorily even when the device is made smaller and thinner.

First aspect of the present invention is a semiconductor device comprising a semiconductor element having a pair of electrodes, a housing having a recess for accommodating the semiconductor element, a first lead electrode and a second lead electrode which are exposed on the bottom of the recess, an adhesive layer for die bonding between the semiconductor element and the first lead electrode, and electrically conductive wires for wire bonding between one electrode of the pair of electrodes of the semiconductor element and the first lead electrode and between the other electrode and the second lead electrode, wherein the housing has at least one wall formed to extend across the bottom surface of the recess so as to divide the surface of the first lead electrode into a die bonding area and a wire bonding area, and the first lead electrode has a cut-out portion which is formed by cutting off a portion of an edge of the lead electrode and located at least just below the wall, while the wall and the bottom portion of the housing are connected to each other through the cut-out portion.

According to the first aspect of the present invention, since the cut-out portion is formed just below the first wall, the first wall and the housing can be connected through the cut-out portion, and therefore a cross-sectional area of a connecting portion between them are increased. This enables it to improve adhesiveness between the first wall and the surface of the first lead electrode. The improved adhesiveness is effective in preventing the adhesive components from leaking to the wire bonding area along the interface between the first lead electrode and the first wall.

The cut-out portion has also an effect of making the first wall easier to pour the molding material when forming it. The passage through which the molding material flows into the first wall is widened by the cut-out portion. The first wall is small in height to such an extent that does not hamper wire bonding, and therefore it is difficult to fill in the molding material which may result in locally insufficient filling in case the molding material has high viscosity. However, forming the cut-out portion widens the passage for filling and makes it easier to fill in with the molding material.

According to the present invention, the cut-out portion may have a form of notch formed by cutting off a portion of the edge of the first lead electrode, or a form of through hole formed in the first lead electrode.

Second aspect of the present invention is a semiconductor device comprising a semiconductor element having a pair of electrodes, a housing having a recess for accommodating the semiconductor element, a first lead electrode and a second lead electrode which are exposed on the bottom surface of the recess, an adhesive layer for die bonding between the semiconductor element and the first lead electrode, and electrically conductive wires for wire bonding between one electrode of the pair of electrodes of the semiconductor element and the first lead electrode and between the other electrode and the second lead electrode, wherein the housing has at least one wall formed to extend across the bottom surface of the recess so as to divide the surface of the first lead electrode into a die bonding area and a wire bonding area, and the first lead electrode has a groove which is formed in the surface thereof so as to extend along the wall and located at least just below the wall, while the bottom of the wall is engaged with the groove.

According to the second aspect of the present invention, the groove is formed in the surface of the first lead electrode, and the first wall is formed on the groove. Since the groove is formed along the first wall which separates the die bonding area and the wire bonding area, even if the adhesive components of the adhesive for die bonding tend to leak form the die bond area to the wire bonding area along the interface between the first lead electrode and the first wall, the adhesive components are stuck in the groove and cannot proceed further. Thus the groove formed just below the first wall enables it to surely prevent the adhesive component from entering the wire bonding area.

Also as the cross section of the first wall is increased by the groove, bonding strength between the first wall and the side wall of the housing is also increased. As the bonding strength is increased, adhesiveness between the first wall and the surface of the first lead electrode can be improved, which is effective in preventing the adhesive components from leaking to the wire bonding area along the interface between the first lead electrode and the first wall.

Furthermore, the second aspect of the present invention is advantageous also when forming the first wall. The groove leads to larger opening for pouring the molding material, which makes it easier to fill in and therefore prevents defections of the first wall formed by insufficient filling in the first wall with the molding material.

The first wall is small in height to such an extent that does not hamper wire bonding, and therefore it is difficult to fill in the molding material which may result in locally insufficient filling in case the molding material has high viscosity. However, forming the groove widens the passage for filling and makes it easier to fill with the molding material.

In the semiconductor device of the present invention, the adhesive components do not overflow nor leak to the wire bonding area even when an adhesive consisting of adhesive components having low surface tension is used in the adhesive layer for die bonding, and the overflow and leak preventing function can be maintained satisfactorily even when the device is made smaller and thinner.

DESCRIPTION OF REFERENCE NUMERALS

Figure 1:
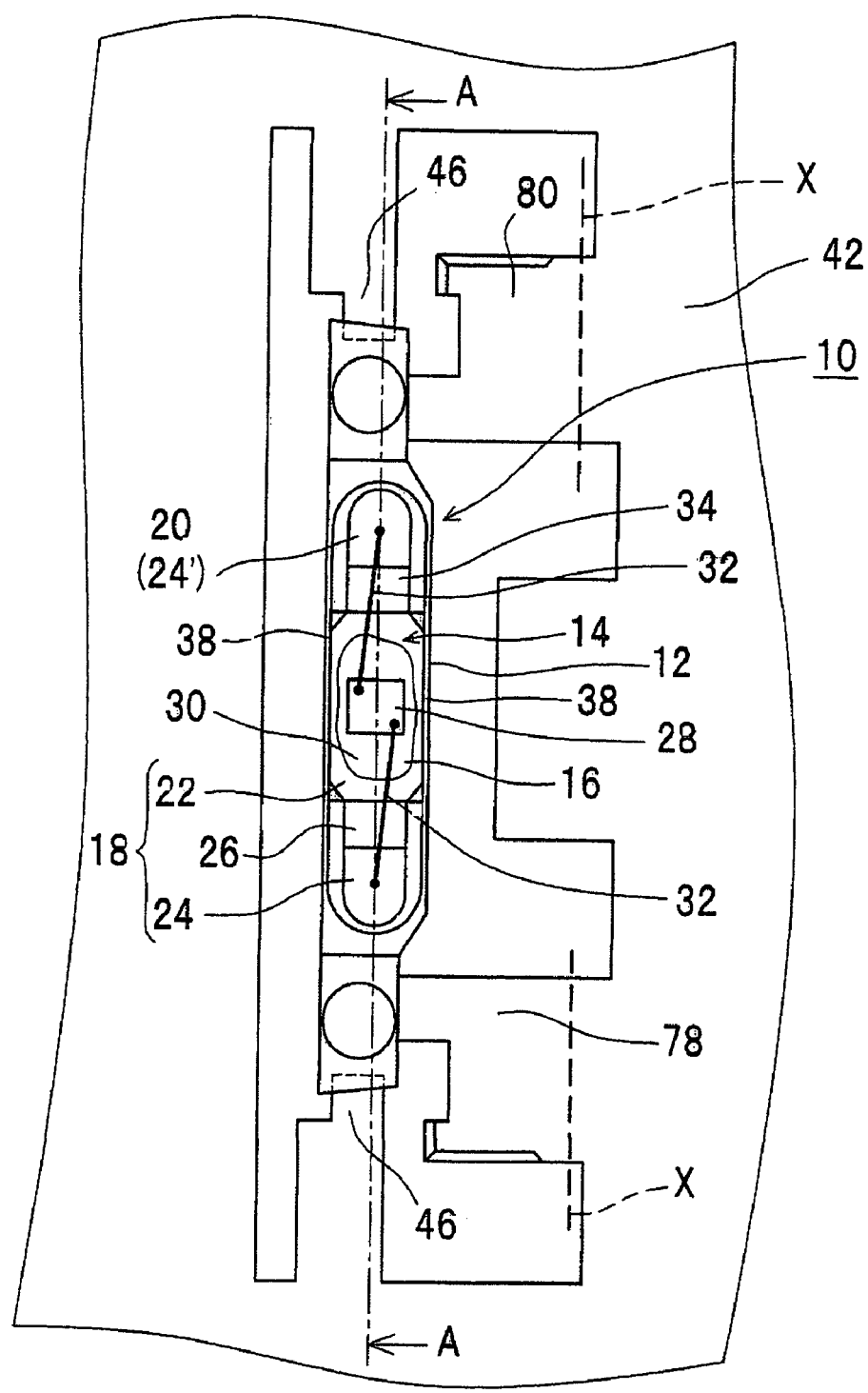
FIG. 1 is a schematic plan view of the semiconductor device according to the first through third embodiments of the present invention.

10 Semiconductor light emitting device
12 Housing
14 Recess
18 First lead electrode
20 Second lead electrode
22 Die bonding area
24, 24' Wire bonding area
26 First wall
28 Semiconductor element
30 Adhesive layer
32 Electrically conductive wire
34 Second wall
36 Notch
36' Through hole
42 Lead frame
50 V groove
52 Protective element
78 First external electrode
80 Second external electrode
181, 182 Edge of first lead electrode
501 One end of V groove
502 Other end of V groove

DETAILED DESCRIPTION OF THE INVENTION

First Embodiment

Figure 2A:
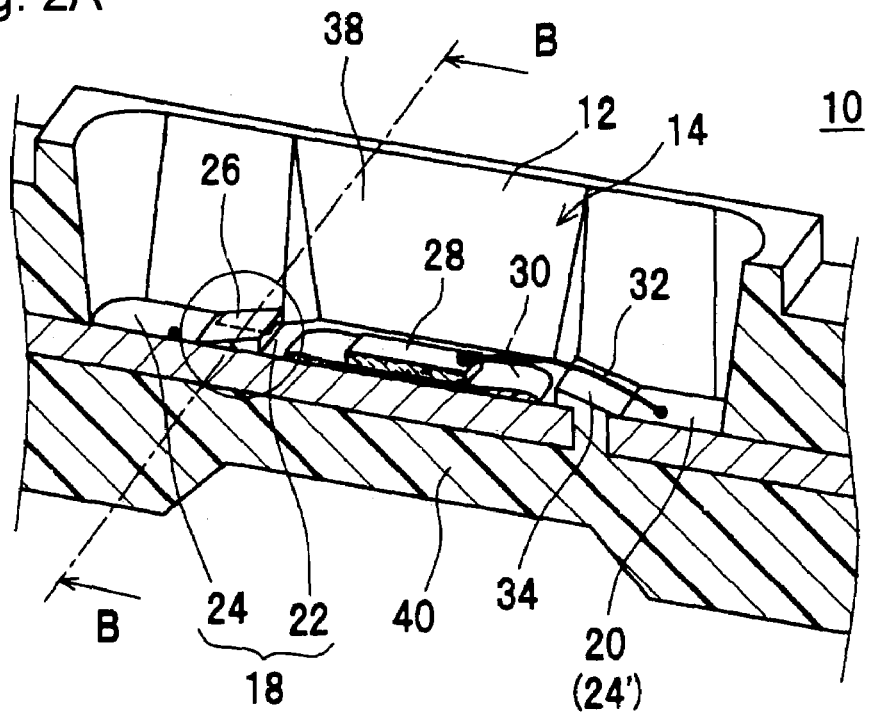
FIG. 2A is a schematic perspective sectional view of the semiconductor device of the first embodiment taken along lines A-A in FIG. 1.
Figure 6:
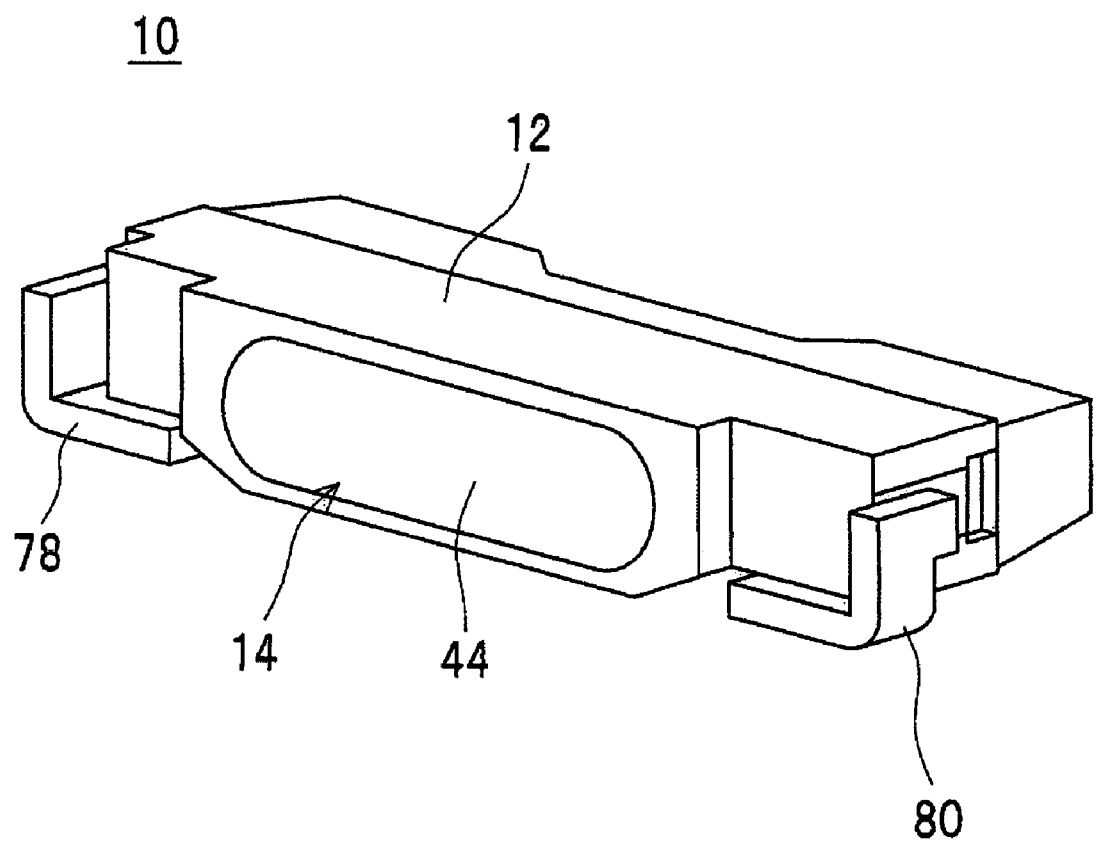
FIG. 6 is a schematic perspective view of the semiconductor device according to the first embodiment.

FIG. 1 and FIG. 2A show a mid stage of the process of manufacturing the semiconductor device according to the first embodiment, which becomes as shown in FIG. 6 in the final state. The semiconductor device 10 shown in FIG. 6 is extremely thin and is used as a thin light emitting device which uses a semiconductor light emitting element as the semiconductor element 28.

The semiconductor device 10 of the first embodiment comprises a housing 12 having a recess 14, a first lead electrode 18 and a second lead electrode 20 which are exposed on the bottom surface 16 of the recess 14. The first lead electrode 18 has a die bonding area 22 and a wire bonding area 24, while these areas are divided by a first wall 26 formed on the surface of the first lead electrode 18 so as to traverse the first lead electrode 18. The second lead electrode 20 is constituted from a wire bonding area 24' only without die bonding area. A second wall 34 is formed to protrude between the first lead electrode 18 and the second lead electrode 20. The first and second walls 26, 34 are formed integrally with the housing 12. The semiconductor element 28 is fixed on the substrate side thereof onto the die bonding area 22 by means of an adhesive layer 30 formed from an adhesive for die bonding, and electrodes formed on the semiconductor side are connected to the wire bonding areas 24, 24' by means of electrically conductive wires 32.

The first and second walls 26, 34 are formed with such a height as the adhesive components of the adhesive used to form the adhesive layer 30 do not bleed from the die bonding area 22 into the wire bonding areas 24, 24' and wire bonding with the electrically conductive wires 32 is not hampered. The walls 26, 34 may be formed in any shape as long as the adhesive components can be prevented from bleeding phenomenon and wire bonding of the electrically conductive wires is not hampered. For example, wall having such a cross section can be employed as rectangle, triangle, trapezoid, semi-circle, or semi-ellipse. It is especially preferable to form the walls 26, 34 with a triangular cross section having slopes rising from the wire bonding areas 24, 24' to the die bonding area 22 as shown in FIG. 2A which is effective in blocking the adhesive components from overflowing and makes it easier to run the electrically conductive wires 32.

As shown in FIG. 1 and FIGS. 2A through 2C, the first wall 26 extends across the first lead electrode 18 and is connected on both ends thereof to the side wall 38 of the housing 12. In the first embodiment, a rectangular notch 36 is formed on the edge of the first lead electrode 18 at a position where the first wall 26 is to be formed. The first wall 26 and the bottom portion 40 of the housing 12 are firmly connected to each other through the notch 36. By forming the notch 36, adhesiveness between the first wall 26 and the surface of the first lead electrode 18 is improved, and bleeding phenomenon of the adhesive components along the interface between the first lead electrode 18 and the first wall 26 can be suppressed more effectively.

The second wall 34 runs between the first lead electrode 18 and the second lead electrode 20 and is connected to the bottom portion 40 of the housing 12, and the second wall 34 is connected on both ends thereof to the side wall 38 of the housing 12. Therefore, the first lead electrode 18 and the second lead electrode 20 are completely separated from each other by the second wall 34.

In the semiconductor device 10 shown in FIG. 1 and FIG. 2A, the die bonding area 22 where the semiconductor element 28 is mounted is surrounded by the first and second walls 26, 34 and the side walls 38, 38' of the housing 12. In this semiconductor device 10, resin layer can be formed selectively only in the vicinity of the semiconductor element 28 by dripping the resin only into the surrounded die bonding area 22. In case the semiconductor light emitting element is used as the semiconductor element 28, for example, a fluorescent material can be disposed only in the vicinity of the semiconductor light emitting element by forming a precoating layer from a translucent resin including the fluorescent material only in the die bonding area 22.

Figure 2B:
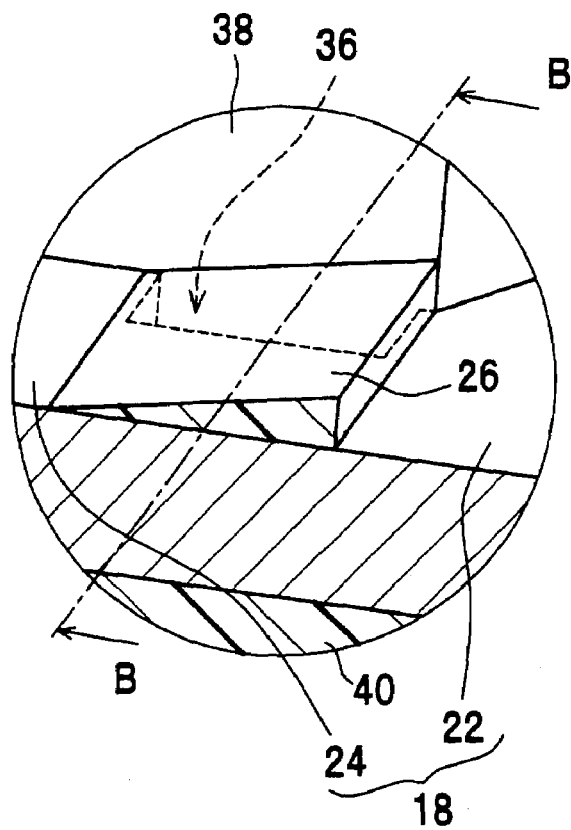
FIG. 2B is a partially enlarged view of a part of FIG. 2A.
Figure 2C:
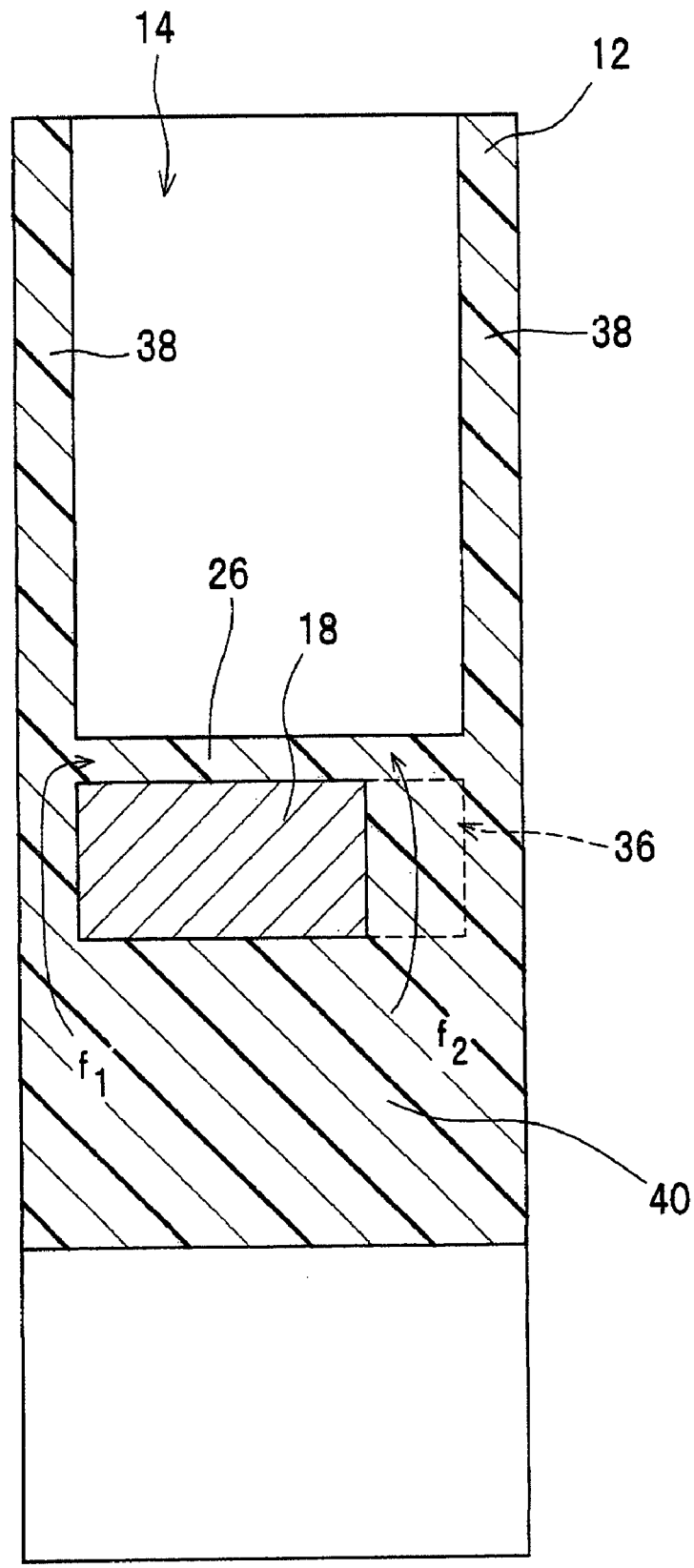
FIG. 2C is a schematic sectional view of the semiconductor device taken along lines B-B in FIG. 2A and FIG. 2B.

As will be seen from FIG. 2B and FIG. 2C, a cross-sectional area of a connecting portion which connects the first wall 26 and the bottom portion 40 of the housing 12 is increased by forming the notch 36 in the first lead electrode 18. This increases the strength of the first wall 26 and improves adhesiveness between the first wall 26 and the surface of the first lead electrode 18. Improved adhesiveness is also effective in preventing the adhesive components from leaking along the interface between the first lead electrode 18 and the first wall 26 and entering the wire bonding area 24.

The notch 36 has also an effect of making it easier to pour the molding material when forming the first wall 26. Arrow $f_1$ (on left side in drawing) and arrow $f_2$ (on right side in drawing) in FIG. 2C indicate the paths along which the molding material flows into the first wall 26, and the passage indicated by arrow $f_2$ is made wider than that indicated by arrow $f_1$ due to the presence of the notch 36. The first wall 26 is formed with lower height to such an extent that does not hamper wire bonding, and it is difficult to fill in the molding material which may result in locally insufficient filling in case a molding material having high viscosity is used. However, forming the notch 36 widens the passage for filling and makes it easier to fill with the molding material. Thus the first embodiment provides an advantage that it becomes easier to form the first lead electrode 18 by forming of the notch 36 in the first lead electrode 18 when providing the first lead electrode 18 which is more difficult to form than the second lead electrode 20.

Also according to the first embodiment, since the semiconductor device has the first lead electrode 18 of smaller width, it is preferable to maintain the strength of the first lead electrode 18 by means of the notch 36 formed by cutting off a portion from the edge of the first lead electrode 18.

While the notch 36 is formed by cutting off a rectangular portion from the edge of the first lead electrode 18 in FIG. 2A and FIG. 2B, the notch 36 is not limited to this shape. For example, the notch may be formed by cutting off in various shapes such as square, trapezoid or other tetragonal shape, polygon such as triangle or pentagon, semi-circle or semi-ellipse. While the notch 36 shown in the drawing has such a size that is hidden behind the first wall 26, it may also be partially exposed beyond the first wall 26. Further, it may also be formed in a tapered shape which varies dimension thereof along the direction of thickness of the first lead electrode 18. In case the dimension decreases from the bottom portion 40 of the housing 12 toward the recess 14, in particular, it becomes easier to pour the molding material and maintain the strength of the first lead electrode 18.

In the semiconductor device 10 of the present invention, it is preferable to fill in the recess 14 of the housing 12 with a resin so as to protect the semiconductor element 28 mounted in the recess 14 from the environment. Particularly in case the semiconductor element 28 is a semiconductor light emitting element, use of a translucent resin for filling makes it possible to extract light. When it is desired to produce light of a color different from that of light from the semiconductor light emitting element 28, a fluorescent material may be mixed in the translucent resin to emit light of different wavelength.

A method for manufacturing the semiconductor device 10 of the present invention will now be described in two parts of 1. a process of manufacturing the housing 1 and 2. a process of making the semiconductor device 10 from the housing 12.

(1. Manufacturing of Housing 12)

The process of manufacturing the housing 12 will now be described with reference to FIG. 3.

First, a metal sheet is punched through and metal plating is applied on the metal sheet thereby to make a lead frame 42. The lead frame 42 has a pair of the first lead electrode 18 and the second lead electrode 20 formed thereon. The first lead electrode 18 and the second lead electrode 20 are formed with a space kept therebetween. Usually a number of pairs of the lead electrodes 18, 20 are formed on one metal sheet.

Figure 3A:
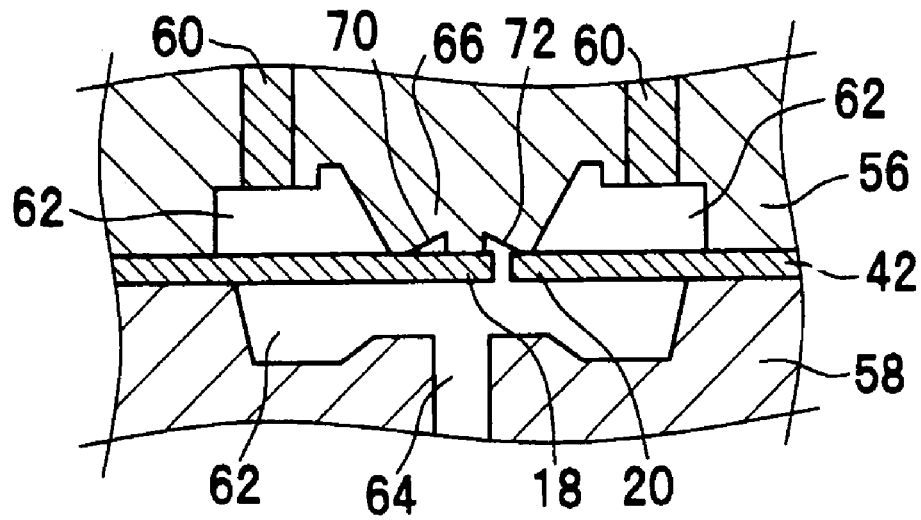
FIG. 3A is a schematic sectional view showing the process of manufacturing the housing for the semiconductor device according to the first embodiment.

As shown in FIG. 3A, the lead frame 42 is disposed between upper and lower molds 56, 58 used in molding the housing. At this time, the lead frame is disposed between the upper and lower molds 56, 58, by positioning the pair of the lead electrodes 18, 20 and the hanger lead 46 of the lead frame 42 in the cavity 62 formed in the molds 56, 58 having the shape of the housing 12. The hanger lead 46 is a member which maintains the posture of the housing 12 which is secured on the lead frame 32, and is formed when the lead frame 42 is punched through. As shown in FIG. 1, distal end of the hanger lead 46 is embedded in the side face of the housing 12 till the housing 12 is separated from the lead frame 32.

The upper mold 56 has a protrusion 66 having the same shape as that of the recess 14 of the housing 12. The protrusion 66 has mold grooves 70, 72 having the same shapes as those of the walls 26, 34 formed therein.

Figure 3B:
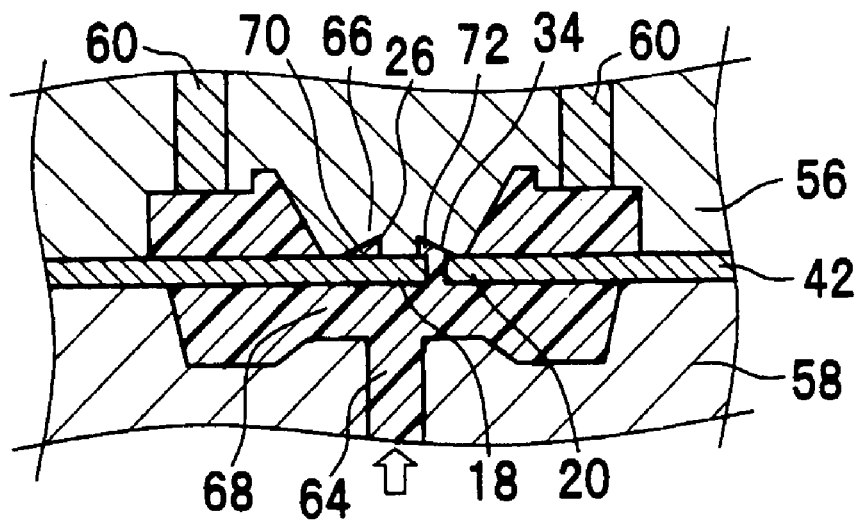
FIG. 3B is a schematic sectional view showing the process of manufacturing the housing for the semiconductor device according to the first embodiment.

Then as shown in FIG. 3B, the molding material 68 is poured through a gate 64 of the lower mold 58 into the cavity 62 of the molds 56, 58. The upper mold 56 has the protrusion 66 having the same shape as that of the recess 14 of the housing 12 formed therein, so that the lead electrodes 18, 20 can be exposed in the bottom surface 16 of the recess 14 of the housing 12 without allowing the molding material 68 to deposit on the top surface of the lead electrode 18, by pouring the molding material 68 while the protrusion 66 is in contact with the top surface of the lead electrode 18.

In this example, while the lead electrode 18 is completely exposed in the bottom surface 16 of the recess 14 of the housing 12, complete exposure is not necessarily required. For example, a part of the lead electrode may also be exposed in the recess by drilling holes in the bottom surface 16 of the recess 14 while positioning the lead electrodes 18, 20 just below the bottom surface 16 of the recess 14 (namely, the lead electrodes 18, 20 are covered by the molding material of the housing). The semiconductor device of the present invention can be formed by establishing electrical connection between the semiconductor element and the lead electrodes through the holes.

The molding material 68 is poured into the mold grooves 70, 72 so as to form the first wall 26 and the second wall 34. Since the mold groove 72 can be filled with the molding material 68 which is poured through the gap between the first lead electrode 18 and the second lead electrode 20, it is made easier to pour the molding material 68. In contrast, it is difficult to fill the mold groove 70 with the molding material 68. With reference made to FIG. 2C, the mold groove 70 can be filled in only by pouring the molding material 68 as indicated by arrow $f_1$ through a narrow gap formed between the first lead electrode 18 and the inner surface of the mold used for molding the external shape of the housing 12.

However, it is made easier to pour the molding material 68 by providing the notch 36 in the first lead electrode 18 as in the first embodiment, since the mold groove 72 can be filled in through the notch 36 as indicated by arrow $f_2$. When the first lead electrode 18 has the notch 36 at the position just below the first wall 26 as described above, it becomes easy to fill the mold groove 70 with the molding material 68 and such defects as the first wall 26 has missing portions due to unsatisfactory filling is less likely to occur.

Figure 3C:
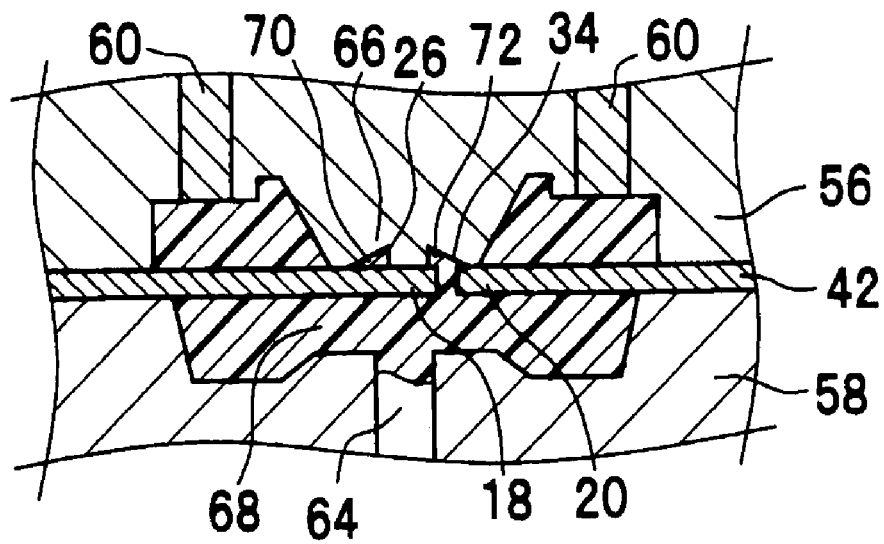
FIG. 3C is a schematic sectional view showing the process of manufacturing the housing for the semiconductor device according to the first embodiment.
Figure 3D:
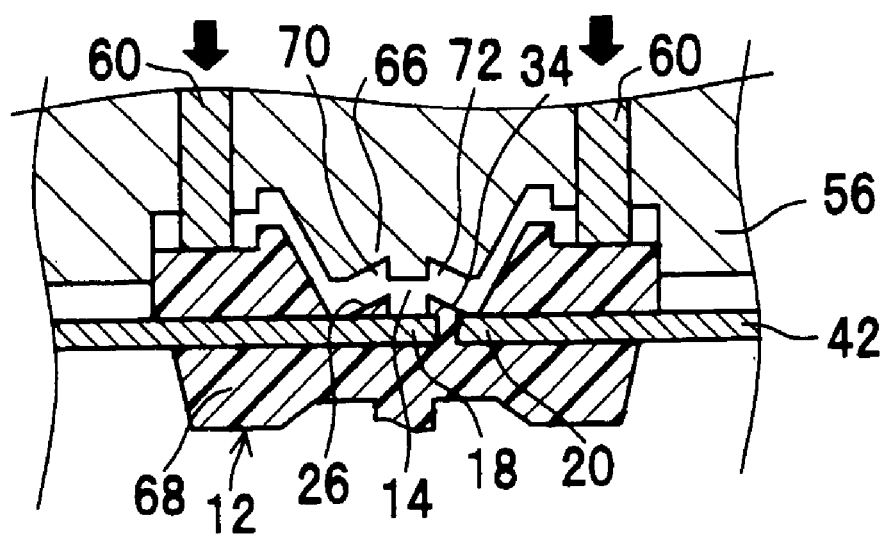
FIG. 3D is a schematic sectional view showing the process of manufacturing the housing for the semiconductor device according to the first embodiment.

When the cavity 62 and the mold grooves 70, 72 in the molds 56, 58 are filled with a sufficient amount of the molding material 68 as shown in FIG. 3C, pouring of the molding material 68 is stopped and the molding material 68 is hardened.

When the molding material 68 has fully hardened, the lower mold 58 is removed first, then the upper mold 56 is removed so as to take out the housing 12. When the upper mold 56 is removed, such troubles tend to occur as the lead frame 42 is distorted or the housing 12 tilts. The housing 12 can be taken out without causing such troubles, for example, by pressing an ejector pin 60, which is inserted slidably to penetrate through the upper mold 56, in the direction indicated by the arrow.

Figure 4:
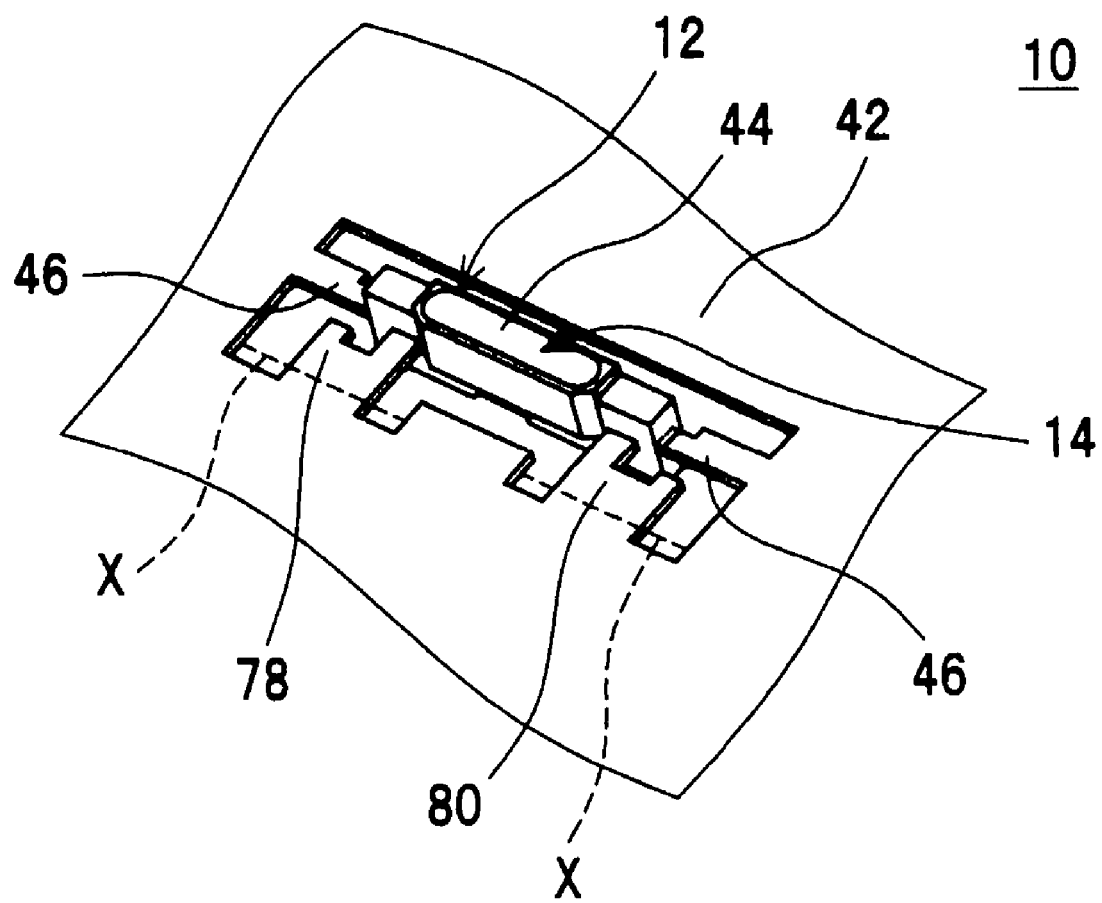
FIG. 4 is a schematic perspective view of the housing for the semiconductor device according to the first embodiment.

The lead frame 42 having the housing 12 shown in FIG. 1 and FIG. 4 formed on a part thereof is obtained through the series of processes shown in FIG. 3.

As shown in FIG. 1, the housing 12 fixed on the lead frame 42 has the first lead electrode 18 and the second lead electrode 20 exposed in the recess 14, the lead electrodes 18, being connected to a first external electrode 78 and a second external electrode 80 which are connected to the lead frame 42, respectively. Distal ends of the hanger leads 46 are embedded in the side face of the housing 12. The housing 12 is held on the lead frame 42 by the external electrodes 78, 80 and the hanger leads 46.

Figure 5:
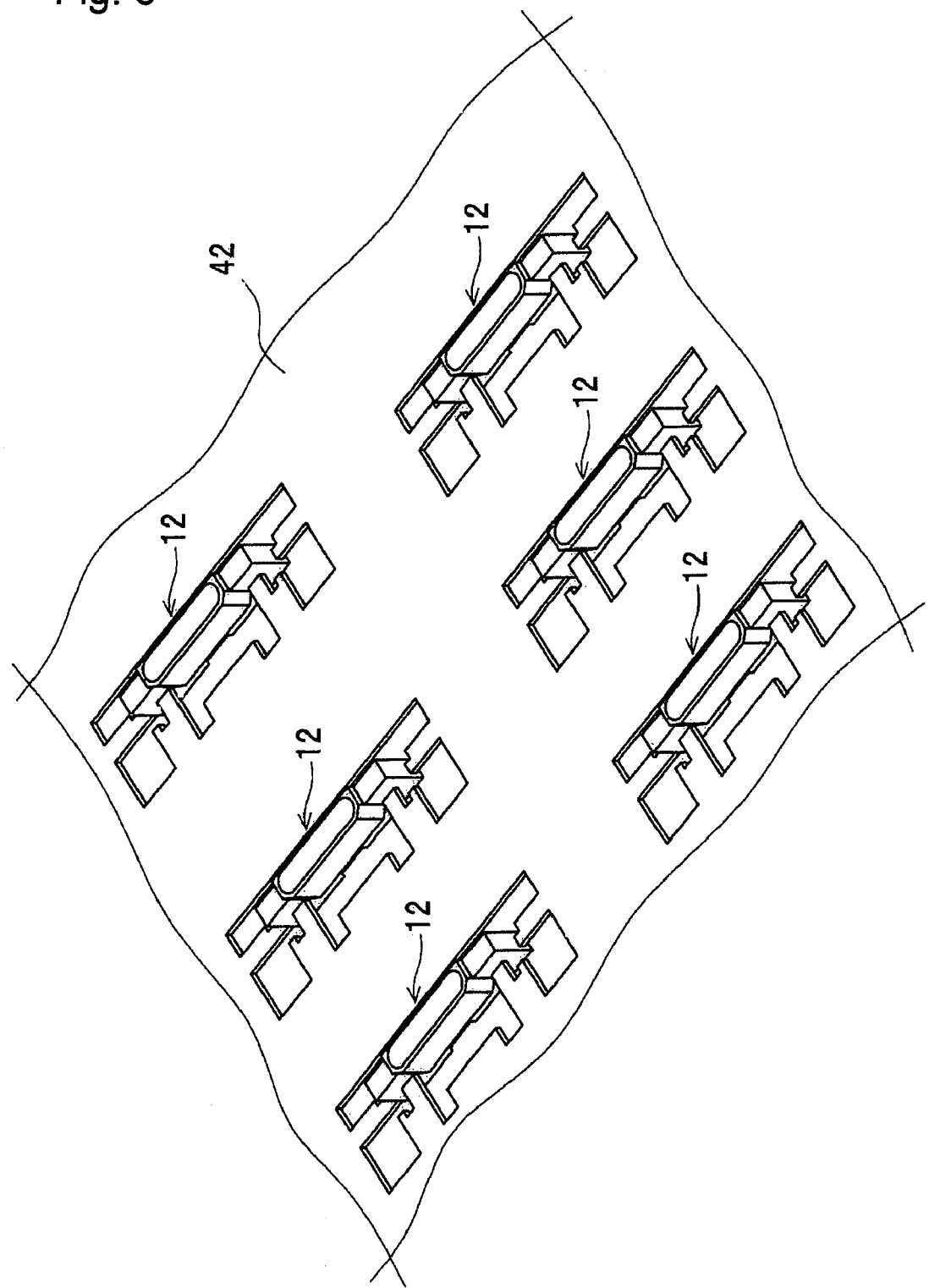
FIG. 5 is a schematic perspective view showing the arrangement of plurality of the housings for the semiconductor device according to the first embodiment.

While FIG. 1 and FIG. 4 show only one housing 12 being formed, normally a number of housings 12 (3 in column and 2 in row, 6 in all) are formed on one lead frame 42 as shown in FIG. 5. In case a number of housings 12 are formed, molds 56, 58 having a number of cavities 62 for molding the housings may be used so that all the housings 12 can be formed simultaneously by pouring the molding material into the cavities 62 simultaneously.

(2. Process of Manufacturing Semiconductor Device 10)

The process of manufacturing the semiconductor device 10 by mounting the semiconductor element 28 on the housing 12 will now be described with reference to FIG. 1 and FIG. 4.

The semiconductor element 28 is die-bonded onto the die bonding area 22 of the first lead electrode 18 within the recess 14 of the housing 12, then the electrodes (positive electrode and negative electrode) of the semiconductor element 28 are connected to the wire bonding area 24 of the first lead electrode 18 and the lead electrode 20 (which is also a wire bonding area 24'), respectively, by wire boding using the electrically conductive wires 32.

The adhesive used in die bonding is selected in accordance to the purpose. When an adhesive having low surface tension is used, for example, the adhesive component may spread over the entire die bonding area 22 so as to cover the surface of the die bonding area 22. However, since the first and second walls 26, 34 are formed between the die bonding area 22 and the wire bonding area 24, 24', the adhesive component does not spread up to the wire bonding area 24, 24'. Therefore, the adhesive component does not make an obstacle to the wire bonding operation carried out after die bonding.

Also because the walls 26, 34 are formed to such a height that does not make an obstacle to the wire bonding operation, wire bonding can be carried out by using the conventional wire bonder, and the electrically conductive wires 32 having a reasonable length can be used, thus keeping the cost of the wire bonding process comparable to that of the prior art.

Then the recess 14 of the housing 12 is filled with a resin 44, so as to seal off the semiconductor element 28 and the electrically conductive wires 32. The resin 44 is hardened after filling in the recess 14 of the housing 12 by potting process or the like.

Then a low-profile white light emitting device can be made by using a blue light emitting diode for the semiconductor light emitting element, using a translucent resin for the resin 44 and dispersing a fluorescent material which absorbs blue light and emits yellow light in the translucent resin. When this low-profile white light emitting device is combined with an optical guide, a light source suitable for a back light is obtained.

When sealing with the resin 44 is completed, the external electrodes 78, 80 are cut off at the position indicated with dashed line X and are separated from the lead frame 42. The external electrodes 78, 80 are bent along the profile of the housing 12, into the J-bend shape shown in FIG. 6 (this operation is called cut forming of the external electrodes 78, 80). Under this condition, the housing 12 is held on the lead frame 42 by the hanger leads 46 only, and it is preferable to use a fixture to hold the housing 12 so as to prevent the housing 12 from tilting and falling off the lead frame 42 due to a stress generated during the cut forming process.

Since the cut forming process can be carried out simultaneously for a plurality of housings 12 formed on one lead frame 42, efficiency of manufacturing the semiconductor device 10 can be improved.

When the semiconductor device 10 shown in FIG. 6 is manufactured, narrow portions of the external electrodes 78, 80 are bent toward the recess 14 of the housing 12 in the early stage of the cut forming process, followed by bending into J-bend shape of the wider portion of the external electrodes 78, 80 protruding beyond the housing 12. Besides this, cut forming may also be carried out by bending the narrow portions of the external electrodes 78, 80 in a direction opposite to the recess 14, or without bending in J-bent shape, depending on the application.

When cut forming is completed, the housing 12 is removed from the lead frame 42. The housing 12 can be removed easily from the distal end portion of the hanger leads 46 by bending the hanger leads 46.

Second Embodiment

Figure 7A:
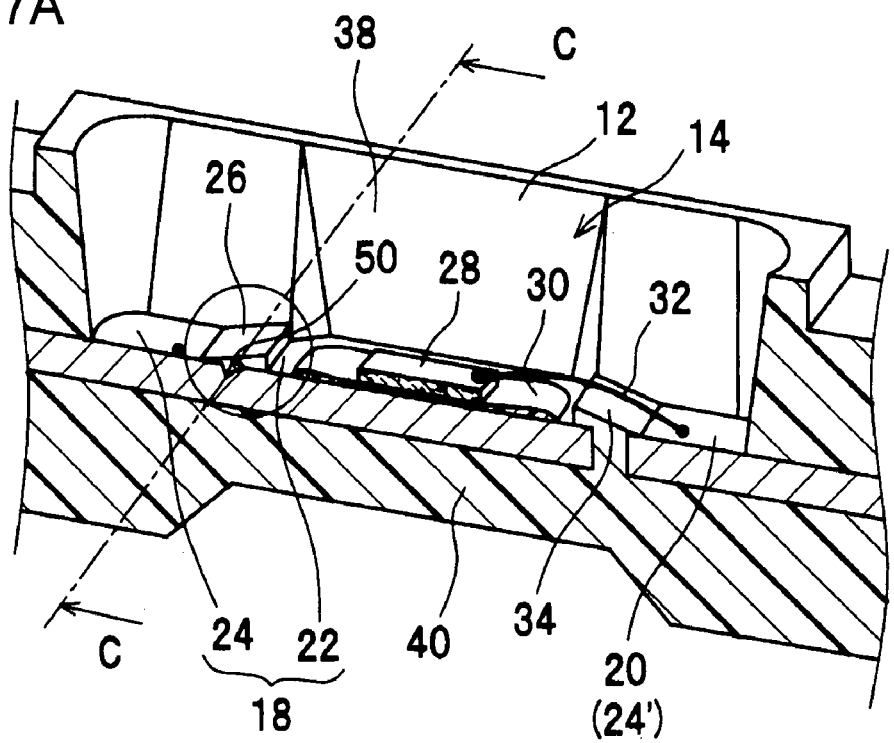
FIG. 7A is a schematic perspective sectional view of the semiconductor device of the second embodiment taken along lines A-A in FIG. 1.
Figure 7B:
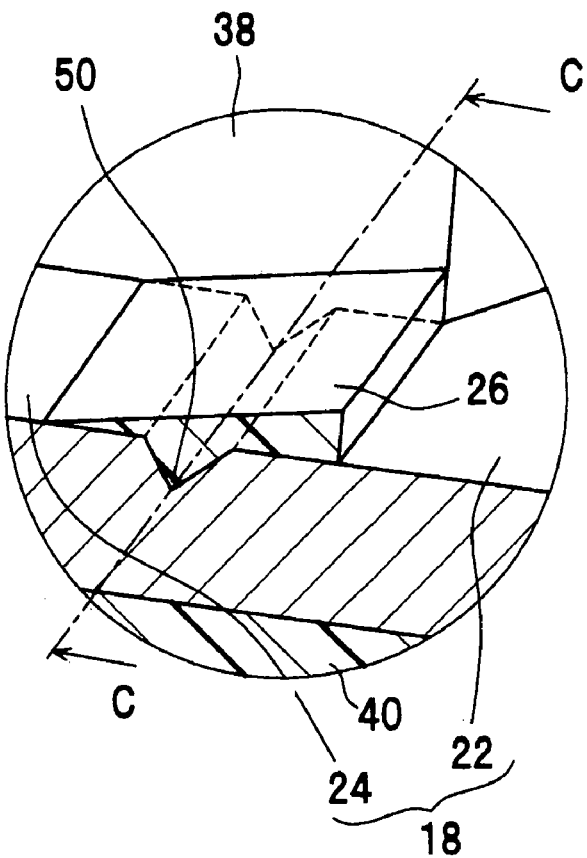
FIG. 7B is a partially enlarged view of a part of FIG. 7A.

The semiconductor device of the second embodiment has a V groove 50 formed on the surface of the first lead electrode 18 as shown in FIG. 7A and FIG. 7B. The V groove 50 is located just below the first wall 26. The semiconductor device 10 of the second embodiment is similar to the first embodiment except for the first lead electrode 18 and the first wall 26.

Figure 7C:
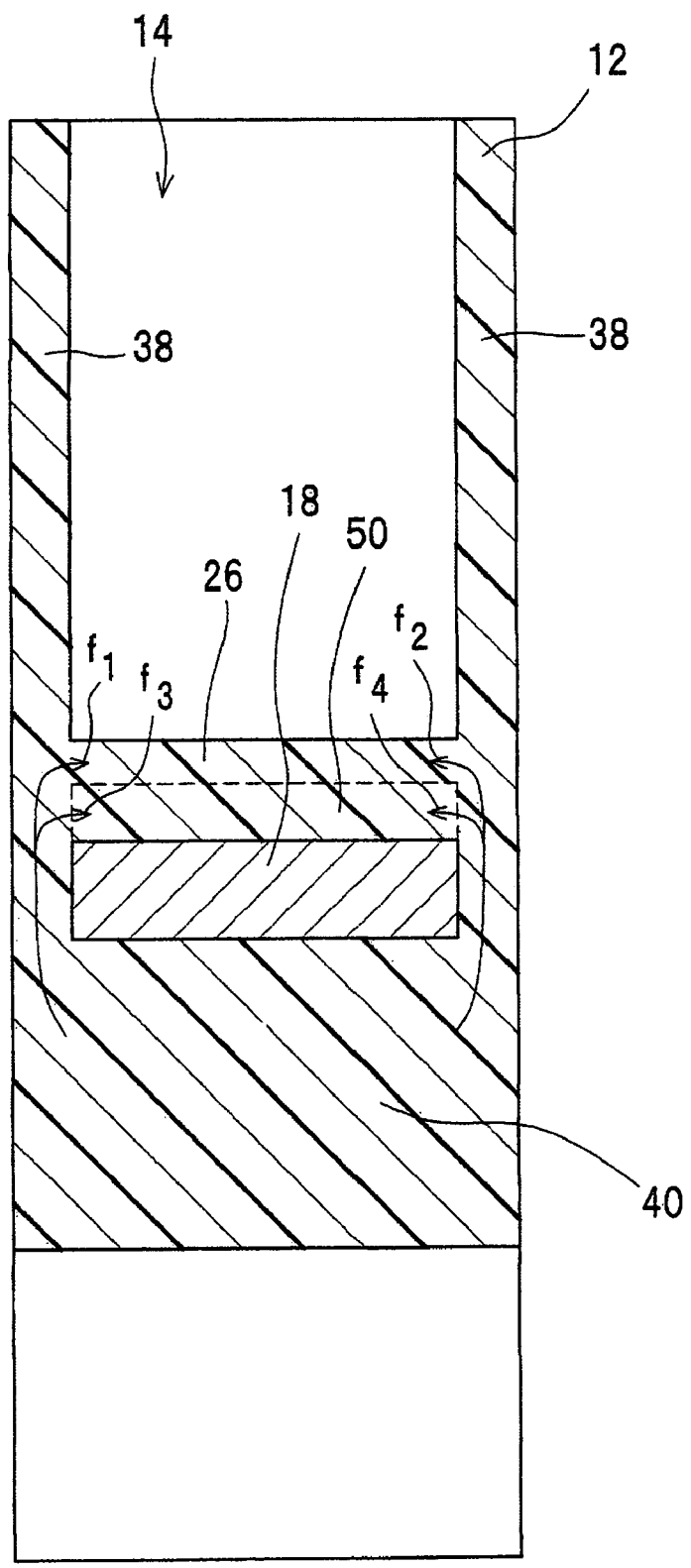
FIG. 7C is a schematic sectional view of the semiconductor device taken along lines C-C in FIG. 7A and FIG. 7B.

As shown in FIG. 7A through FIG. 7C, the first wall 26 extends across the surface of the first lead electrode 18 and is bonded on both ends thereof with the side wall 38 of the housing 12. In the second embodiment, the V groove 50 is formed on the surface of the first lead electrode 18, and the first wall 26 is formed on the V groove 50. The V groove 50 is preferably formed along the first wall 26 that separates the die bonding area 22 and the wire bonding area 24. In this case, the V groove 50, together with the first wall 26, separates the surface of the first lead electrode 18 into the die bonding area 22 and the wire bonding area 24. When the V groove 50 is provided, components of the adhesive used in die bonding, even if it has leaked along the interface between the first lead electrode 18 and the first wall 26 toward the wire bonding area 24, sinks in the V groove 50 and cannot proceed further. Thus forming the V groove 50 just below the first wall 26 makes it possible to reliably prevent the adhesive component from entering the wire bonding area 24.

As the cross sectional area of the first wall 26 increases by the size of the V groove 50, strength of the first wall 26 increases. The increase in the cross sectional area of the first wall 26 also increases the bonding strength between the first wall 26 and the side wall 38 of the housing 12. As the bonding strength is increased, adhesiveness between the first wall 26 and the surface of the first lead electrode 18 is improved, thus effectively suppressing the adhesive components from leaking to the wire bonding area 24 along the interface between the first lead electrode 18 and the first wall 26.

Existence of the V groove 50 is advantageous also when forming the first wall 26. Further it provides an advantage when pouring the molding material 68 into the molds 56, 58 in a process corresponding to that shown in FIG. 3B. That is, when the molding material 68 is poured into the mold groove 70 of the upper mold 56 to form the first wall 26 as shown in FIG. 7C, the molding material 68 is poured through the narrow portions indicated by $f_1$ and $f_2$ in case the V groove 50 is not formed. In case the V groove 50 is formed, in contrast, the molding material 68 can be poured through wider portions indicated by arrows $f_3$ and $f_4$ thereby making it easier to fill in. Thus in case the first lead electrode 18 has the V groove 50 formed just below the first wall 26, it becomes easier to fill the mold groove 70 with the molding material 68, and such defect as the first wall 26 has missing portions due to unsatisfactory filling is less likely to occur. In this way, the second embodiment is advantageous also for making it easier to form the first lead electrode 18 due to the V groove 50 formed in the first lead electrode 18, when providing the first lead electrode 18 which is more difficult to form than the second lead electrode 20.

The V groove 50 formed in the surface of the first lead electrode 18 may be replaced with a groove having other cross sectional shape. For example, cross section of the groove may have various shapes such as square, trapezoid or other tetragonal shape, polygon such as triangle or pentagon, semicircle or semi-ellipse. The cross section of the V groove 50 is preferably V-shaped since it can be formed by pressing a simple tool against the surface and is more effective in preventing the intrusion of the adhesive component.

In the semiconductor device 10 shown in FIG. 7A, the semiconductor device 22 where the semiconductor element 28 is disposed is surrounded by the first wall 26, the second wall 34 and the side walls 38 of the housing 12. In this semiconductor device 10, resin layer can be formed selectively only in the vicinity of the semiconductor element 28 by dripping the resin only into the surrounded die bonding area 22. In case the semiconductor light emitting element is used as the semiconductor element 28, for example, a fluorescent material can be disposed only in the vicinity of the semiconductor light emitting element by forming a precoating layer from a translucent resin including the fluorescent material only in the die bonding area 22.

Third Embodiment

Figure 8A:
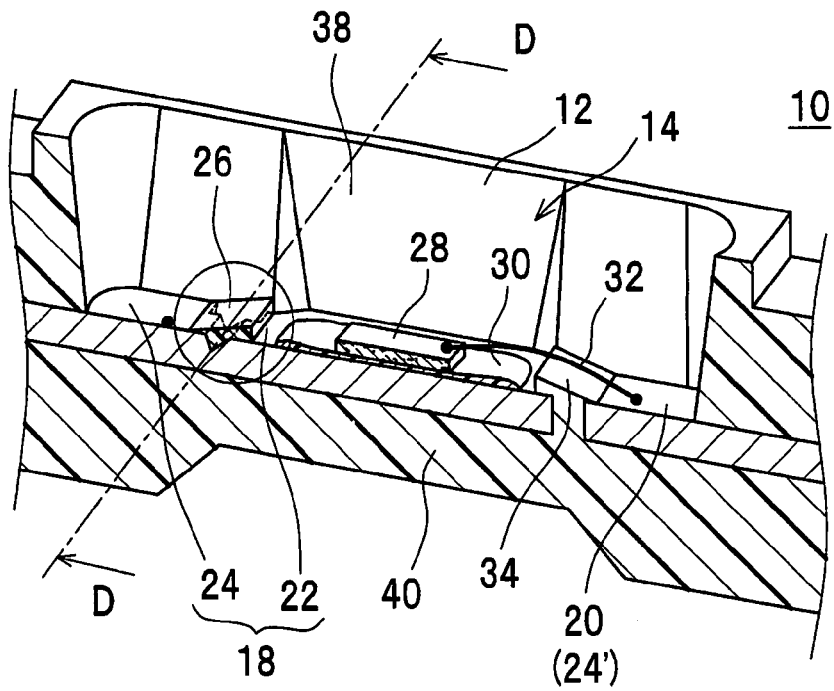
FIG. 8A is a schematic perspective sectional view of the semiconductor device of the third embodiment taken along lines A-A in FIG. 1.
Figure 8B:
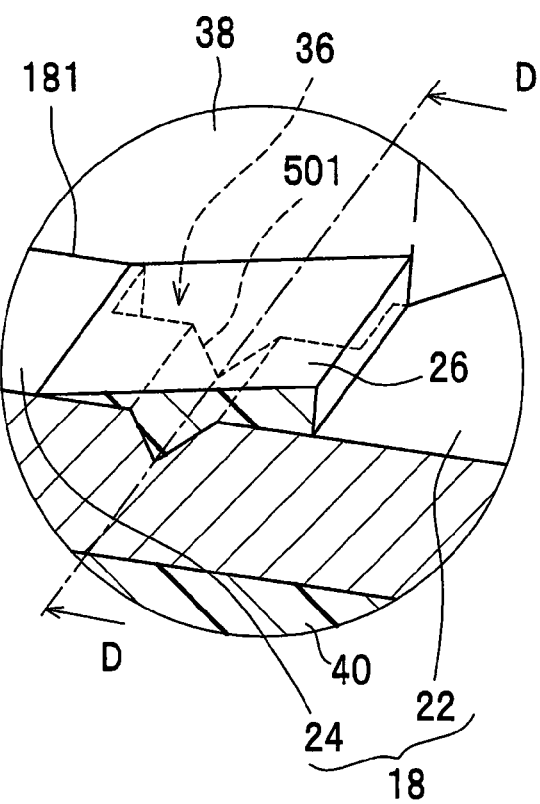
FIG. 8B is a partially enlarged view of a part of FIG. 8A.

The first embodiment employs the notch 36 and the second embodiment employs the V groove 50. The semiconductor device of the third embodiment has both the notch 36 and the V groove 50 formed in the first lead electrode 18 as shown in FIG. 8A and FIG. 8B. With other respects, the third embodiment is similar to the first and second embodiments. Details of the notch 36 and the V groove 50 are also similar to those of the first and second embodiments except for the points described below.

Figure 8C:
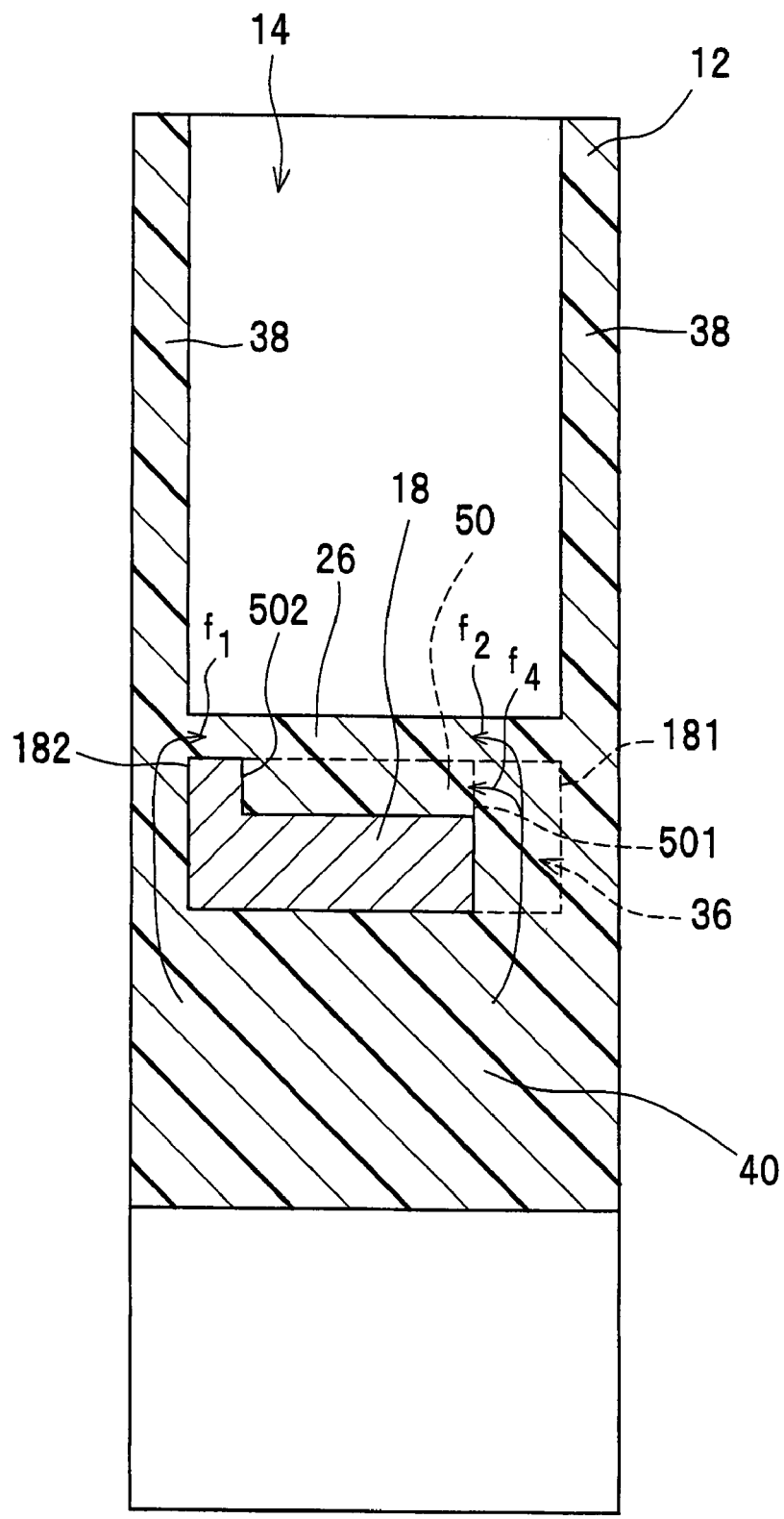
FIG. 8C is a schematic sectional view of the semiconductor device taken along lines D-D in FIG. 8A and FIG. 8B.

As shown in FIG. 8A through FIG. 8C, the first wall 26 extends across the surface of the first lead electrode 18 and is bonded with the side wall 38 of the housing 12 on both ends.

In the third embodiment, the rectangular notch 36 is formed in an edge 181 of the first lead electrode 18 at a position where the first wall 26 is to be formed. This constitution, similarly to the notch 36 of the first embodiment, achieves the effect of improving the bonding between the first wall 26 and the surface of the first lead electrode 18 and suppressing the adhesive components from bleeding phenomenon along the interface between the first lead electrode 18 and the first wall 26.

In the third embodiment, the V groove 50 is formed in the surface of the first lead electrode 18, and the first wall 26 is formed on the V groove 50. The V groove 50 is preferably formed along the first wall 26 that separates the die bonding area 22 and the wire bonding area 24. In this case, the V groove 50, together with the first wall 26, separates the surface of the first lead electrode 18 into the die bonding area 22 and the wire bonding area 24. Thus forming the V groove 50 just below the first wall 26 makes it possible to reliably prevent the adhesive component from entering the wire bonding area 24.

According to the third embodiment, since one end 501 of the V groove 50 is connected to the notch 36, it is very advantageous when pouring the molding material 68 into the molds 56, 58 in a process corresponding to that shown in FIG. 3B.

Arrow $f_1$ (on left side in drawing) and arrows $f_2$ and $f_4$ (on right side in drawing) in FIG. 8C indicate the paths along which the molding material 68 flows into the mold groove 70 of the mold 56 for forming the first wall 26. The paths indicated by arrows $f_2$ and $f_4$ are made wider than that indicated by arrow $f_1$ due to the presence of the notch 36. The first wall 26 is formed with small in height to such an extent that does not hamper wire bonding, and the space of the mold groove 70 is accordingly narrower. As a result, it is difficult to fill the mold groove 70 with the molding material, thus giving rise to the possibility of locally insufficient filling in case a molding material having high viscosity is used. However, forming the notch 36 widens the path of filling and makes it easier to fill in with the molding material 68.

Since the molding material 68 which has passed the paths indicated by arrows $f_2$ and $f_4$ flows through the space widened by the V groove 50 and enters the mold groove 70, it becomes easier to fill than in the case where the V groove 50 is not formed.

As described above, providing the notch 36 and the V groove 50 and connecting them have the advantage of making it easier to fill in to form the first wall 26, compared to the first and second embodiments.

On the other hand, the portion of the first lead electrode 18 located just below the first wall 26 is made narrower due to the notch 36 and thinner due to the V groove 50, and has lower strength than the other portions of the first lead portion. There is also a possibility that the first lead electrode 18 bends along the V groove 50 or breaks when the distal end of the first lead electrode 18 is subjected to stress during the manufacturing process.

For this reason, in the third embodiment, the other end 502 of the V groove 50 is terminated at a position short of the edge 182 of the first lead electrode 18 so as to suppress the strength of the first lead electrode 18 from decreasing too much. However, it is more desirable from the view point of filling with the molding material 68, that the other end 502 of the V groove 50 reaches the edge 182 of the first lead electrode 18. Therefore, it is preferable to extend the other end 502 to the edge 182 in case the first lead electrode 18 is strong enough and there is no possibility of bending or breaking.

Fourth Embodiment

Figure 9A:
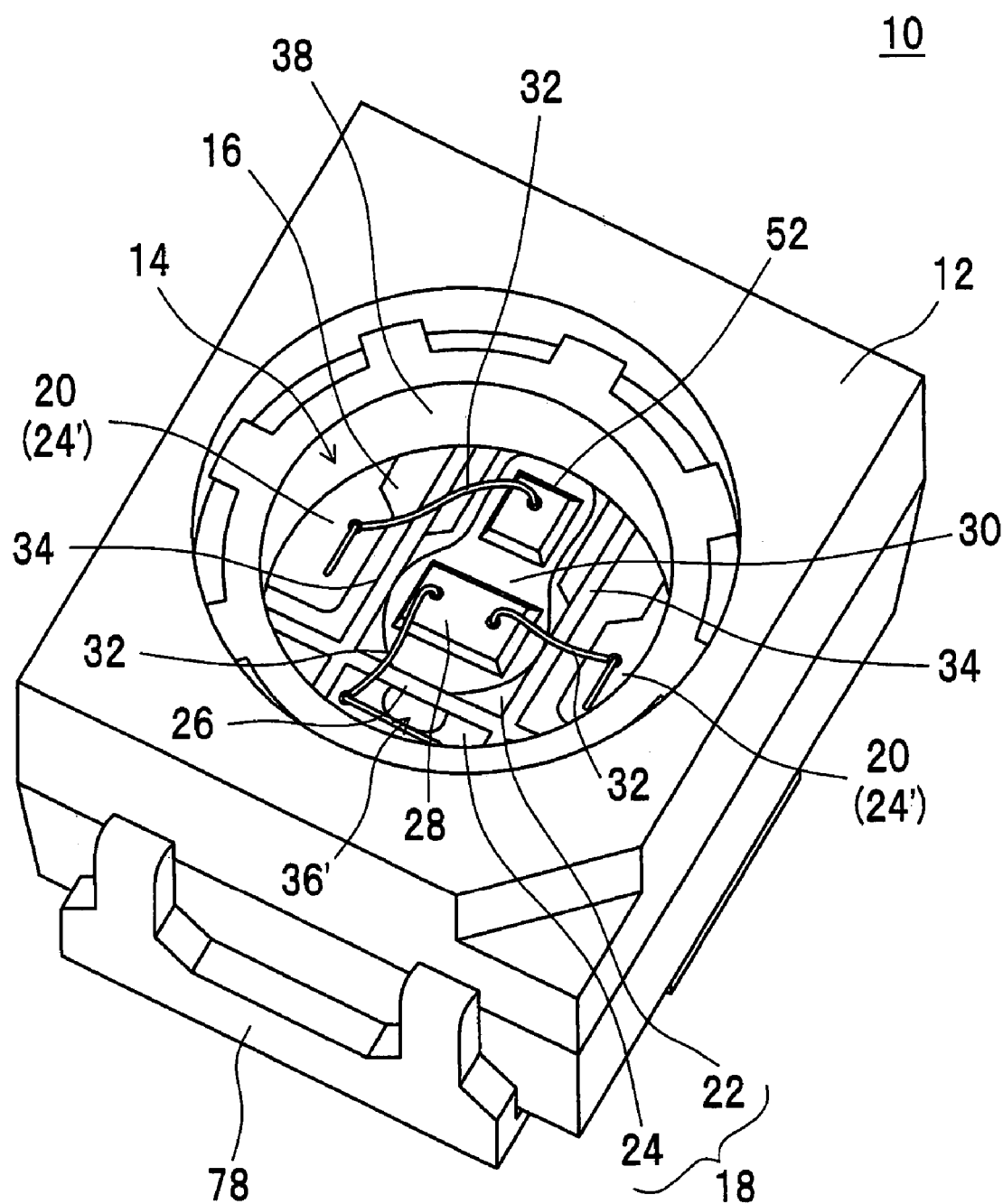
FIG. 9A is a schematic perspective view of the semiconductor device according to the fourth embodiment.
Figure 9B:
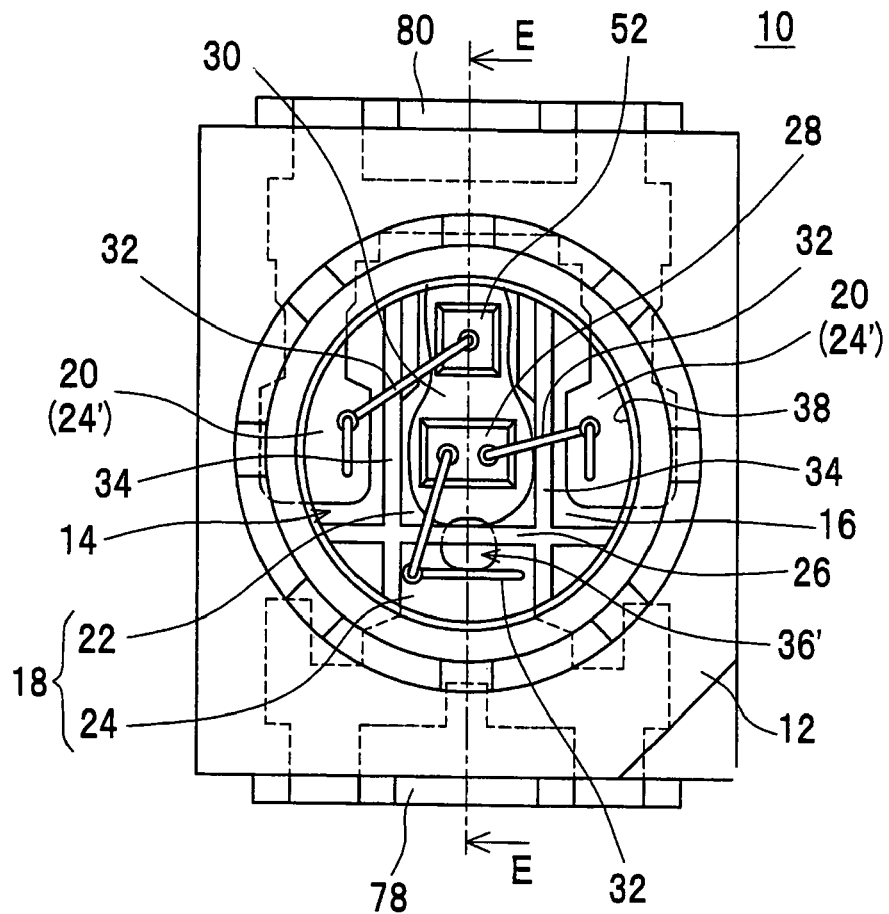
FIG. 9B is a schematic plan view of the semiconductor device according to the fourth embodiment.
Figure 9C:
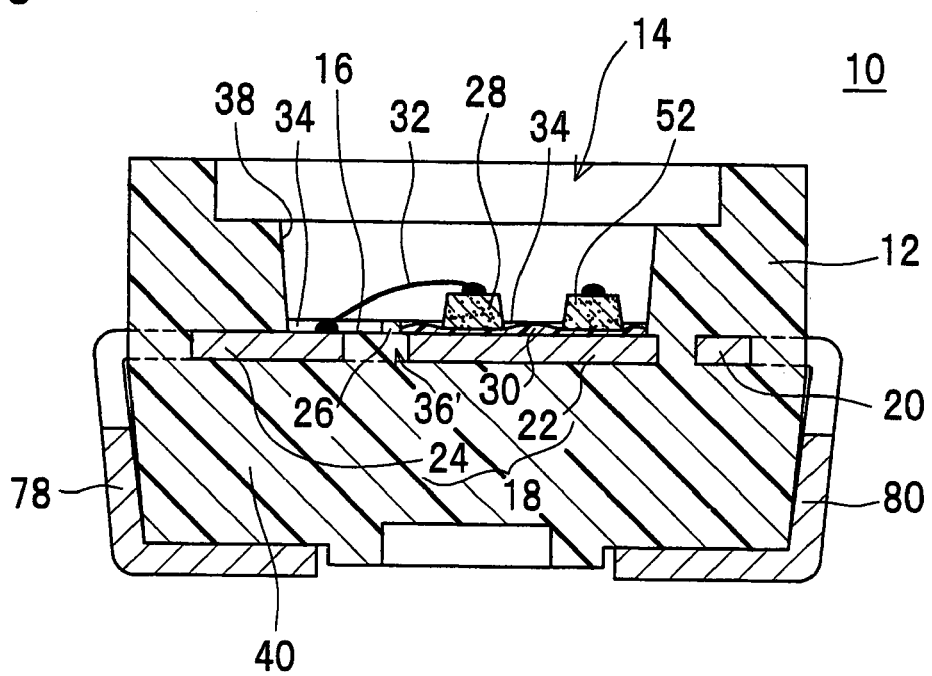
FIG. 9C is a schematic sectional view of the semiconductor device taken along lines E-E in FIG. 9B.

FIG. 9A through FIG. 9C show the semiconductor device 10 of the third embodiment comprising the housing 12 having the recess 14, the first lead electrode 18 and the second lead electrode 20 which are exposed in the bottom surface 16 of the recess 14. The first lead electrode 18 has the die bonding area 22 and the wire bonding area 24 which are separated by the first wall 26 disposed to extend across the first lead electrode 18. The second lead electrode 20 is constituted from the wire bonding area 24' only without the die bonding area. Disposed to protrude between the first lead electrode 18 and the second lead electrode 20 is the second wall 34. The first and second walls 26, 34 are formed integrally with the housing 12. The semiconductor element 28 is fixed on the substrate side thereof onto the die bonding area 22 by means of the adhesive layer 30 formed from the adhesive for die bonding, and electrodes formed on the semiconductor side are connected to the wire bonding areas 24, 24' by means of electrically conductive wires 32. The semiconductor device 10 has a protective element 52 that prevents surge current from flowing into the semiconductor element 28. The protective element is also die-bonded onto the die bonding area 22 by means of an adhesive.

In the fourth embodiment, the first wall 26 and the second wall 34 are connected and are formed at the same time. The first and second walls 26, 34 are formed with small in height to such an extent that the adhesive component does not bleed from the die bonding area 22 to the wire bonding area 24, 24' and the wall does not hamper the wire bonding operation by means of the electrically conductive wires 32. The walls 26, 34 may be formed in any shape as long as the adhesive components can be prevented from bleeding phenomenon and wire bonding of the electrically conductive wires is not hampered. For example, besides the rectangular shape shown in FIG. 9A through FIG. 9C, the wall may have such cross section as triangle, trapezoid, semi-circle, or semi-ellipse.

As shown in FIGS. 9A through 9C, the first wall 26 extends across the surface of the first lead electrode 18 and extends to the side wall 38 of the housing 12. In the fourth embodiment, the first lead electrode 18 has a round through hole 36' formed therein, so that the first wall 26 and the bottom portion 40 of the housing 12 are firmly connected to each other via the through hole 36'. By forming the through hole 36', adhesiveness between the first wall 26 and the surface of the first lead electrode 18 can be improved, and bleeding phenomenon of the bonding resin along the interface between the first lead electrode 18 and the first wall 26 can be suppressed more effectively.

The second wall 34 connects to the bottom portion 40 of the housing 12 via the space between the first lead electrode 18 and the second lead electrode 20, and the second wall 34 extends on both ends thereof to the side wall 38 of the housing 12. Thus the first lead electrode 18 and the second lead electrode 20 are completely separated from each other in the recess of the housing by the second wall 34.

The first lead electrode 18 has the through hole 36' formed at a position where the first wall 26 is to be formed. As will be seen from FIGS. 9A through 9C, forming the through hole 36' causes the mid portion of the first wall 26 to be connected to the bottom portion 40 of the housing 12. This increases the strength of the first wall 26 and improved adhesiveness between the first wall 26 and the surface of the first lead electrode 18. Improved adhesiveness is also effective in preventing the adhesive components from leaking along the interface between the first lead electrode 18 and the first wall 26 and entering the wire bonding area 24. The notch 36 has also such effects to make it easier to pour the molding material when forming the first wall 26, and make such defect less likely to occur as the first wall 26 has defections due to unsatisfactory filling.

Since the semiconductor device of the fourth embodiment has the first lead electrode 18 of larger width, strength of the first lead electrode 18 can be maintained even when the first lead electrode 18 has the through hole 36' formed to penetrate therethrough. In the case of the first lead electrode 18 of larger width, the through hole 36' formed at a position other than the edge of the first lead electrode 18 is more preferable than the notch 36 formed in the edge as in the first embodiment, and functions also as the so-called anchor hole which keeps the first lead electrode 18 from lifting due to the bonding between the first wall 26 and the bottom portion 40 of the housing 12.

While the through hole 36' is formed by cutting off in round or rectangular shape in the case shown in FIG. 9A through FIG. 9C, the through hole 36' is not limited to this shape, and may be formed by cutting of in various shapes such as square, trapezoid or other tetragonal shape, polygon such as triangle or pentagon, semi-circle or semi-ellipse. Diameter of the through hole 36' shown in the drawing is preferably larger than the width of the first wall 26. This is for the following reason.

The molding material 68 poured into the through hole 36' can relatively easily flow in the longitudinal direction of the mold groove 70 but is difficult to flow in the lateral direction, when the mold groove 70 of the mold 56 is filled with the molding material 68 for forming the first wall 26. Difficulty of flowing becomes more remarkable when height of the mold groove 70 becomes smaller. In the present invention, since height of the first wall 26 is made small to such an extent that does not hamper wire bonding with the electrically conductive wire 32, it is very difficult for the molding material 68 which has entered through the through hole 36' to flow in the direction of width of the mold groove 70. As a result, such defect may occur as the first wall 26 has defections due to unsatisfactory filling in the lateral direction of the first wall 26 in the vicinity of the through hole 36'. However, when the through hole 36' is formed with a diameter larger than the width of the first wall 26, the molding material 68 which has entered through the through hole 36' fills the first wall 26 to the full width thereof in the early stage, and therefore the problem of unsatisfactory filling with the molding material 68 does not occur.

However, in case the molding material 68 has high fluidity and can completely fill in the mold groove 70, diameter of the through hole 36' may be smaller than the width of the first wall 26.

The V groove 50 may also be formed in the surface of the first lead electrode 18 as in the second embodiment. The groove is preferably formed along the first wall 26 just below the first wall 26. With the V groove being formed, even when the adhesive components of the adhesive for die bonding leak along the interface between the first lead electrode 18 and the first wall 26 and enter the wire bonding area, the adhesive components are stuck in the groove and cannot proceed further.

Since the molding material is poured through the V groove into the space intended for the first wall 26 when forming the first wall 26, complete filling is enabled. As a result, such a defect as the first wall 26 has defections due to unsatisfactory filling is less likely to occur even when small volume and narrow pouring gate make it difficult to fill in.

In the semiconductor device 10 of the present invention, it is preferable to fill in the recess 14 of the housing 12 with a resin so as to protect the semiconductor element 28 mounted in the recess 14 from the environment. Particularly in case the semiconductor element 28 is a semiconductor light emitting element, use of a translucent resin for filling makes it possible to extract light. When it is desired to produce light of a color different from that of light from the semiconductor light emitting element 28, a fluorescent material may be mixed in the translucent resin to emit light of different wavelength.

Although the semiconductor device 10 of the fourth embodiment is considerably different from the semiconductor device 10 of the first embodiment in shape, it can be manufactured by the same manufacturing method when proper lead frame and molds are used.

Preferable Materials

Materials suitable for the constituent members of the semiconductor device 10 of the first through fourth embodiments will be described in detail below.

(First and Second Lead Electrodes 18, 20, First and Second External Electrodes 78, 80)

The first lead electrode 18, the second lead electrode 20, the first external electrode 78 and the second external electrode 80 are all formed from the same electrically conductive material. For the purpose of ensuring the ease of machining and the strength, such materials are preferably used as iron, copper, copper-clad iron, copper-clad tin, and aluminum, iron or copper plated with copper, gold or silver.

(Housing 12 and Walls 26, 34)

The housing 12 and the walls 26, 34 may be formed from a thermoplastic resin such as liquid crystal polymer, polyphthalamide resin or polybutylene terephthalate (PBT). A semi-crystalline polymer which contains a crystal having a high melting point such as polyphthalamide resin is preferably used for the reason of high surface energy and good bonding with the sealing resin which fills the recess 14 of the housing 12. Use of such a material makes it less likely that the housing and the sealing resin would be parted along the interface thereof when the resin is cooled down in the process of pouring and hardening the sealing resin. In case the semiconductor device 10 is made by using semiconductor light emitting element for the semiconductor element 28, reflectivity of the housing 12 may be increased by mixing a white pigment such as titanium oxide in the molding material.

(Adhesive Layer 30)

The adhesive layer 30 is formed from the adhesive used in die bonding, such as epoxy resin, silicone resin or other insulating adhesive, silver paste or other electrically conductive adhesive.

According to the present invention, providing the wall enables it to use an adhesive which contains adhesive components having low surface tension such as epoxy resin which has been difficult to use in the prior art.

(Electrically Conductive Wire 32)

For the electrically conductive wire 32 used in wire bonding, for example, metal wire such as gold, copper, platinum, aluminum or an alloy thereof may be used.

(Resin 44)

For the resin 44 which seals the recess 14, resins having high weatherability can be preferably used such as silicone resin, epoxy resin, urea resin, fluororesin and hybrid resin which includes at least one of these resins. Instead of the resin 44, an inorganic material such as glass or silica gel having high light fastness may also be used. These resins and inorganic materials can be made translucent, and are therefore preferably used when manufacturing the semiconductor light emitting device 10.

When a semiconductor light emitting device 10 which emits white light is manufactured, a blue light emitting diode may be used for the semiconductor element 28, using the translucent resin 44 with a fluorescent material particles dispersed therein. For the fluorescent material, a rare earth element-based fluorescent material which absorbs blue light and emits yellow light (for example, YAG fluorescent material) is preferably used.

What is claimed is:

1. A semiconductor device comprising:
   a semiconductor element having a pair of electrodes;
   a housing having a recess for accommodating the semiconductor element;
   a first lead electrode and a second lead electrode exposed on the bottom surface of said recess;
   an adhesive layer for die bonding between the semiconductor element and the first lead electrode; and
   electrically conductive wires for wire bonding between one electrode of the pair of electrodes of the semiconductor element and the first lead electrode and between the other electrode and the second lead electrode,
   wherein the housing has at least one wall formed to extend across the bottom surface of the recess so as to divide the surface of the first lead electrode into a die bonding area and a wire bonding area;
   the first lead electrode has a notch which is formed by cutting off a portion of an edge of the first lead electrode and located at least just below the wall; and
   the wall and the bottom portion of said housing are connected to each other through the notch.

2. A semiconductor device comprising:
   a semiconductor element having a pair of electrodes;
   a housing having a recess for accommodating the semiconductor element;
   a first lead electrode and a second lead electrode exposed on the bottom surface of the recess;
   an adhesive layer for die bonding between the semiconductor element and the first lead electrode; and
   electrically conductive wires for wire bonding between one electrode of the pair of electrodes of the semiconductor element and the first lead electrode and between the other electrode and the second lead electrode,
   wherein the housing has at least one wall formed to extend across the bottom surface of the recess so as to divide the surface of the first lead electrode into a die bonding area and a wire bonding area;
   the first lead electrode has a through hole located at least just below the wall; and
   the wall and the bottom portion of the housing are connected to each other through the through hole.

3. The semiconductor device according to claim 1, wherein the first lead electrode further has a groove which is formed in the surface thereof so as to extend along the wall and located at least just below the wall, the bottom of the wall being engaged with the groove.

4. The semiconductor device according to claim 2, wherein the first lead electrode further has a groove which is formed in the surface thereof so as to extend along the wall and located at least just below the wall, the bottom of the wall being engaged with the groove.

5. A semiconductor device comprising:
   a semiconductor element having a pair of electrodes;
   a housing having a recess for accommodating the semiconductor element;
   a first lead electrode and a second lead electrode exposed on the bottom surface of the recess;
   an adhesive layer for die bonding between the semiconductor element and the first lead electrode; and
   electrically conductive wires for wire bonding between one electrode of the pair of electrodes of the semiconductor element and the first lead electrode and between the other electrode and the second lead electrode,
   wherein the housing has at least one wall formed to extend across the bottom surface of the recess so as to divide the surface of the first lead electrode into a die bonding area and a wire bonding area;
   the first lead electrode has a groove which is formed in the surface thereof so as to extend along the wall and located at least just below the wall; and
   the bottom of the wall is engaged with the groove.

6. A semiconductor device comprising:
   a semiconductor element having a pair of electrodes;
   a housing having a recess for accommodating the semiconductor element;

a first lead electrode and a second lead electrode exposed on the bottom surface of the recess;

an adhesive layer for die bonding between the semiconductor element and the first lead electrode; and electrically conductive wires for wire bonding between one electrode of the pair of electrodes of the semiconductor element and the first lead electrode and between the other electrode and the second lead electrode, wherein the housing has at least one wall formed to extend across the bottom surface of the recess so as to divide the surface of the first lead electrode into a die bonding area and a wire bonding area;

the first lead electrode has a notch which is formed by cutting off a portion of an edge of the first lead electrode and located at least just below the wall so that the wall and the bottom portion of the housing are connected to each other through the notch;

the first lead electrode has a groove which is formed in the surface thereof so as to extend along the wall and located just below the wall;

one end of the groove extends to the edge of the first lead electrode and connects with the notch;

the other end of the groove terminates short of the edge of the first lead electrode; and bottom portion of the wall is engaged with the groove.

* * * * *